(12) United States Patent
Cugat et al.

(10) Patent No.: US 9,025,229 B2
(45) Date of Patent: May 5, 2015

(54) ELECTROMAGNETICALLY ACTUATED MICROSHUTTER

(75) Inventors: Orphee Cugat, Poisat (FR); Nicolas Abele, Lausanne (CH)

(73) Assignee: Intel Corporation, Santa Clara, CA (US)

( * ) Notice: Subject to any disclaimer, the term of this patent is extended or adjusted under 35 U.S.C. 154(b) by 356 days.

(21) Appl. No.: 13/504,760

(22) PCT Filed: Oct. 27, 2010

(86) PCT No.: PCT/FR2010/052301
§ 371 (c)(1),
(2), (4) Date: Aug. 6, 2012

(87) PCT Pub. No.: WO2011/051620
PCT Pub. Date: May 5, 2011

(65) Prior Publication Data
US 2013/0003155 A1    Jan. 3, 2013

(30) Foreign Application Priority Data
Oct. 27, 2009 (FR) .................................... 09 57543

(51) Int. Cl.
*G02B 26/08* (2006.01)
*B81B 3/00* (2006.01)
(Continued)

(52) U.S. Cl.
CPC ......... *B81B 3/0021* (2013.01); *B81B 2201/045* (2013.01); *B81B 2203/0181* (2013.01); *G02B 26/085* (2013.01); *H02K 26/00* (2013.01); *H02K 33/18* (2013.01)

(58) Field of Classification Search
CPC ............... G02B 26/105; G02B 26/085; B81B 2201/045; B81B 2203/0181; B81B 3/0021; H02K 26/00; H02K 33/18

USPC .................. 359/199.3, 200.7, 227, 230, 234, 359/223.1–226.2, 212.1–215.1, 221.2; 396/452, 457, 463, 493, 497, 469, 508; 310/36, 40 R

See application file for complete search history.

(56) References Cited

U.S. PATENT DOCUMENTS 5,883,382 A 3/1999 Asada
6,122,089 A 9/2000 Minamoto et al.
(Continued)

FOREIGN PATENT DOCUMENTS

EP 1538474 A1 6/2005
JP H10-123449 A 5/1998
(Continued)

OTHER PUBLICATIONS

English Translation of International Search Report dated Sep. 21, 2012, for related International Application No. PCT/FR2010/052301.
(Continued)

*Primary Examiner* — James Phan
(74) *Attorney, Agent, or Firm* — Kacvinsky Daisak Bluni PLLC

(57) ABSTRACT

The invention relates to an electromagnetically actuated microshutter comprising: a moveable plate that can rotate about an axis, connected to a stationary frame by two arms aligned on both sides of the plate to said axis, and comprising on its periphery a conductive loop; and below the assembly formed by the stationary frame and the moveable plate, a group of magnets having distinct magnetic orientations, arranged in such a manner so as to create, in regard to the moveable plate, a lateral magnetic field, in the plane of the frame, oblique in relation to the axis of rotation.

7 Claims, 4 Drawing Sheets

(51) Int. Cl.
*H02K 26/00* (2006.01)
*H02K 33/18* (2006.01)

(56) References Cited

U.S. PATENT DOCUMENTS

| | | | |
|---|---|---|---|
| 6,188,504 | B1 | 2/2001 | Murakami et al. |
| 6,989,921 | B2 | 1/2006 | Bernstein et al. |
| 7,224,507 | B2 * | 5/2007 | Kamiya et al. ............ 359/290 |
| 7,391,222 | B2 | 6/2008 | Nishio |
| 8,587,853 | B2 | 11/2013 | Takeda |
| 2005/0002085 | A1 | 1/2005 | Matsui |

FOREIGN PATENT DOCUMENTS

| | | |
|---|---|---|
| JP | 2002-156598 A | 5/2002 |
| JP | 2002-221686 A | 8/2002 |
| JP | 2003-153518 A | 5/2003 |
| JP | 2004-243512 A | 9/2004 |

OTHER PUBLICATIONS

English Translation of Written Opinion of the International Searching Authority dated Dec. 4, 2012, for related International Application No. PCT/FR2010/052301.

* cited by examiner

ELECTROMAGNETICALLY ACTUATED MICROSHUTTER

CROSS-REFERENCE TO RELATED APPLICATIONS

This application is the national stage application under 35 U.S.C. §371 of International Application No. PCT/FR2010/052301 and claims the benefit of Int'l Application No. PCT/FR2010/052301, filed Oct. 27, 2010 and French Application No. 09/57543, filed Oct. 27, 2009, the entire disclosures of which are incorporated herein by reference in their entireties.

FIELD OF THE INVENTION

The present invention relates to moveable microshutters formed by production methods for micro-electromechanical systems (MEMS). In particular, it pertains to a new electromagnetically actuated microshutter structure. An example of application of the present invention relates to electromagnetically actuated micro-mirrors.

DESCRIPTION OF PRIOR ART

Moveable micro-mirrors based on MEMS technology are used in numerous devices, for example, in miniaturized projection systems, and in visible or infrared light sensors, such as bar code readers. Of interest here are micro-mirrors attached to a frame by an axis and orientatable around this axis by electromagnetic means.

FIG. 1 schematically shows an MEMS structure, formed in a silicon wafer, including an electromagnetically actuated moveable micro-mirror. This structure comprises a reflective, moveable small plate 1, or micro-mirror, attached to a stationary frame 3. A gap 5 extends between moveable plate 1 and frame 3. Plate 1 is connected to frame 3 by two arms 7 and 9 aligned on both sides of the plate, along a same axis 11. Thus, plate 1 is rotatable around axis 11 formed by arms 7 and 9. The movement of plate 1 exerts torsion on arms 7 and 9.

A conductive path 13 follows the periphery of the front face of plate 1. Path 13 passes across arm 7 and ends in contacts 15 and 17 formed on frame 3. Contacts 15 and 17 are suited to be connected to a power source, which is not shown, in such a manner that a current flows in conductive path 13 in the direction represented by arrows 19 (in the case of direct current).

The assembly of frame 3 and plate 1 are subjected to a lateral magnetic field, represented by arrows 21, wherein the field lines are substantially perpendicular to axis 11 and substantially parallel to the plane of frame 3.

When a current flows through conductive path 13, opposite Laplace forces are exerted orthogonally to the plane of the frame, on the portions of path 13 parallel to axis 11, and in which opposite currents flow. These combined forces produce a rotation of plate 1 around its axis 11, of an angle determined in particular by the direction and intensity of the current. Therefore, it is possible to modulate the orientation and inclination of plate 1 by varying the sign and value of the voltage applied between contacts 15 and 17.

FIG. 2 shows a cross-sectional view that schematically represents an MEMS structure including an electromagnetically actuated micro-mirror of the type described in relation to FIG. 1. In this view, one can see that the silicon wafer is hollowed out below the location where moveable plate 1 is formed. A support 23 closes off this recess. Also generally provided above the micro-mirror is a cover, which is not shown and is preferably transparent to protect plate 1 from the intrusion of contaminants.

Two magnets 25 and 27 are placed symmetrically on both sides of axis 11. Magnets 25 and 27, having a lateral magnetic orientation create, in the area of mobile plate 1, a magnetic field whose field lines are orthogonal to axis 11 and parallel to the plane of frame 3.

A disadvantage of micro-mirror structures of the type described in relation to FIGS. 1 and 2 lies in the size associated with the placement of magnets 25 and 27.

In practice, moveable plate 1 may be a square measuring about 1 mm on a side, gap 5 may measure substantially 50 μm, and the frame may have a width of substantially 1 mm.

The surface area (as seen from above) of magnets 25 and 27 is added to the surface area of frame 3. And yet, magnets 25 and 27 are relatively distant from moveable plate 1. Therefore, to ensure a sufficient field in the area of moveable plate 1, they must have dimensions on the order of 2 mm wide, 2 mm thick, and 3 mm long. The total surface area of the structure is therefore at least doubled by the presence of magnets 25 and 27.

FIG. 3 schematically shows another MEMS structure including an electromagnetically actuated micro-mirror. For clarity's sake, only the differences in relation to FIG. 2 shall be detailed.

To limit the size, it is proposed to replace magnets 25 and 27 having a lateral magnetic orientation in FIG. 2 by a magnet 31 having a vertical magnetic orientation, placed under the assembly formed by moveable plate 1 and frame 3. Magnet 31 creates, in regard to the moveable plate, a magnetic field whose field lines are orthogonal to the plane of frame 3.

A conductive coil divided into two separate windings 33 and 35 of the opposite direction, arranged on the front face of plate 1, on the side of each of the edges of plate 1 that are parallel to axis of rotation 11, respectively, is provided. This coil is suitable to be connected to a power source.

When a current flows in the coil, opposing attractive and repelling forces are exerted between magnet 31 and each of the windings 33 and 35, resulting in a rotational movement of moveable plate 1 around its own axis 11.

A disadvantage of this type of micro-mirrors lies in the loss of usable surface on the front face of moveable plate 1, which is associated with the dimensions of windings 33 and 35. The mass of the moveable part will also be greater, which requires one to provide, for a given magnetic field, higher currents to result in its displacement. In addition, because of its increased mass, the moveable plate will be less resistant to impacts and accelerations.

SUMMARY

Therefore, an object of an embodiment of the present invention is to propose an electromagnetically actuated microshutter structure that compensates for all or some of the disadvantages of conventional structures.

An object of an embodiment of the present invention is to propose such a structure that has a small surface dimension.

An object of an embodiment of the present invention is to propose such a structure that is simple to produce.

Therefore, an embodiment of the present invention provides for an electromagnetically actuated microshutter comprising: a plate that is rotatable about an axis, connected to a stationary frame by two arms aligned on both sides of the plate along said axis, and comprising on its periphery a conductive loop; and under the assembly formed by the stationary frame and the moveable plate, a group of magnets of distinct magnetic orientations arranged in such a manner as to create, for the moveable plate, a lateral magnetic field, in the plane of the frame, that is oblique in relation to the axis of rotation.

According to an embodiment of the present invention, from a top-down view, the dimensions of the group of magnets are strictly equal to the dimensions of the assembly formed by the stationary frame and the moveable plate.

According to an embodiment of the present invention, the lateral magnetic field is orthogonal to the axis of rotation.

According to an embodiment of the present invention, the group of magnets comprises three magnets in the shape, as seen from the top, of bars parallel to the axis of rotation, juxtaposed in the same plane parallel to the plane of the stationary frame, the central magnet having the same width as the moveable plate and having a lateral magnetic orientation; and the peripheral magnets having magnetic orientations orthogonal to the plane of the frame and in the opposite direction.

According to an embodiment of the present invention, the extremities of the conductive loop cross one of the arms and are connected to contact elements formed on the stationary frame.

According to an embodiment of the present invention, the upper surface of the moveable plate is reflective.

According to an embodiment of the present invention, the microshutter has a protective cover above the stationary frame.

According to an embodiment of the present invention, the moveable plate is connected to the stationary frame by means of a moveable frame connected to the stationary frame by two arms aligned on both sides of the moveable frame relative to a secondary axis of rotation that is orthogonal to said axis, the moveable frame comprising a conductive loop.

According to an embodiment of the present invention, the lateral magnetic field is substantially 45 degrees in relation to the axis of rotation.

BRIEF DESCRIPTION OF THE DRAWINGS

These objects, characteristics, and advantages, as well as others, shall be explained in detail in the following description of specific embodiments, given by way of non-limiting example in relation to the enclosed drawings, wherein.

DETAILED DESCRIPTION

For clarity's sake, identical elements were designated by the same references in the different drawings and, in addition, as is common in showing micro-components, the various figures are not drawn to scale.

Figure 1:
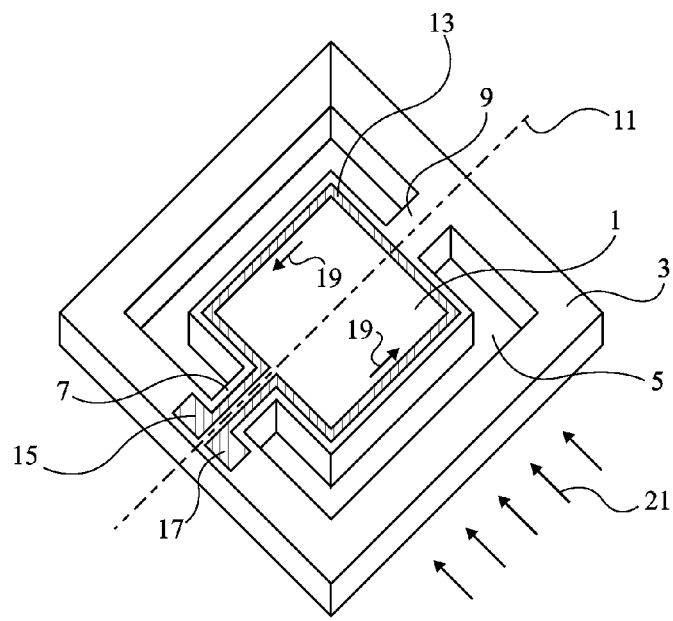
FIG. 1, described earlier, schematically shows a structure including an electromagnetically actuated micro-mirror.
Figure 2:
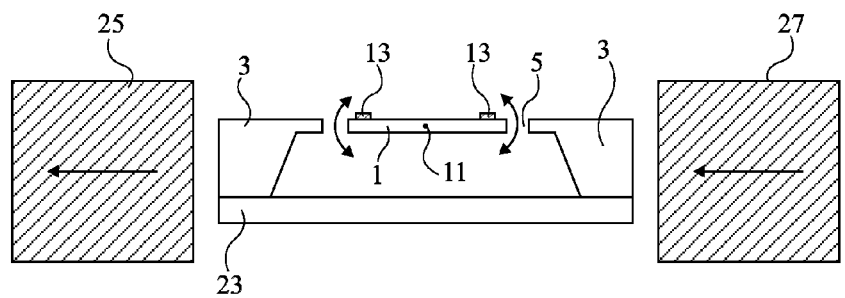
FIG. 2, described earlier, is a cross-sectional view of a structure of the type described in relation to FIG. 1.
Figure 3:
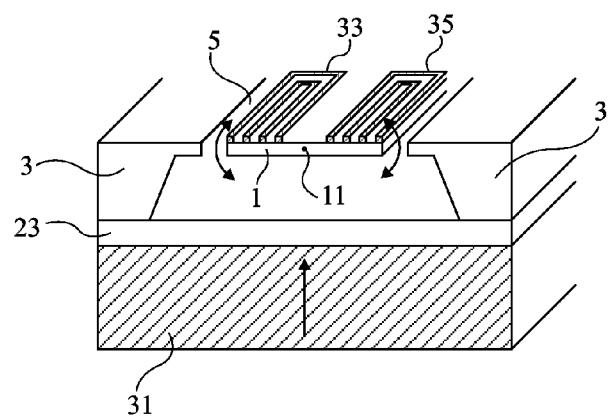
FIG. 3, described earlier, is a cross-sectional view schematically showing another structure including an electromagnetically actuated micro-mirror.
Figure 4:
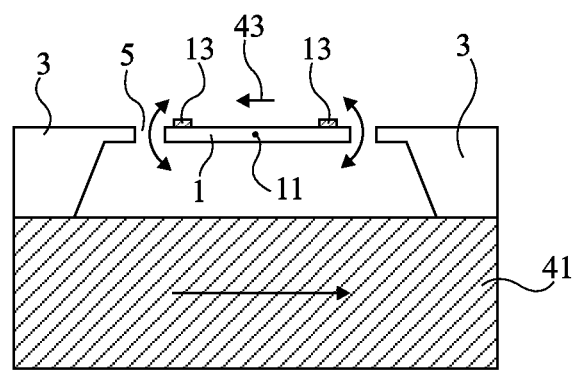
FIG. 4 is a cross-sectional view schematically showing a sample structure including an electromagnetically actuated micro-mirror.

FIG. 4 is a cross-sectional view schematically showing a sample structure including an electromagnetically actuated micro-mirror, formed in a silicon wafer. Like the structure described in relation to FIG. 2, this structure comprises a reflective, moveable plate 1, fixed in a stationary frame 3. A gap 5 separates moveable plate 1 from frame 3. Moveable plate 1 is connected to frame 3 by two, or pairs of arms, not shown, aligned on both sides of the plate along the same axis 11. Thus, plate 1 is rotatable about axis 11.

A conductive loop 13 follows the periphery of the front face of moveable plate 1. The extremities of path 13 cross, for example, over one of the mounting arms of plate 1 and end in contacts, not shown, formed on frame 3 and suitable for being connected to a power source.

A magnet 41, having a lateral magnetic orientation, is placed under the assembly formed by moveable plate 1 and frame 3. Such a magnet creates, in regard to moveable plate 1, a magnetic field substantially orthogonal to axis of rotation 11. This field is connected to the return field lines from one of the magnet's poles to the other, and its direction, shown by arrow 43, is substantially opposite to the magnetic orientation of magnet 41.

When a current flows through conductive path 13, opposite Laplace forces are exerted on portions of path 13 that are parallel to axis 11 and in which opposite currents flow. This causes a rotation of moveable plate 1 about its own axis 11, according to an angle determined by the direction and intensity of the current.

However, such a structure is purely theoretical. In fact, the magnetic field created by the magnet is distributed all around it, and with respect to the moveable plate, the field is insufficient to obtain a significant displacement of plate 1. It would require a high-intensity current moving through loop 13 to obtain a significant displacement of the moveable plate, which would result in an excessive consumption of energy.

Figure 5:
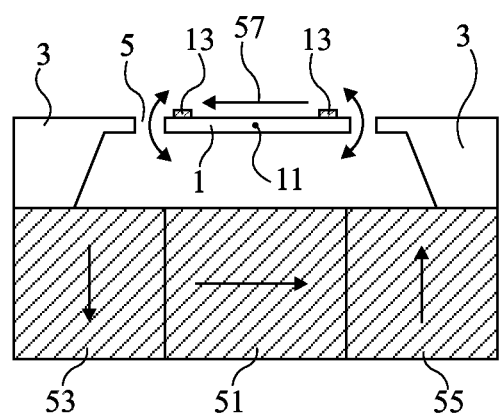
FIG. 5 is a cross-sectional view schematically showing a sample structure including an electromagnetically actuated micro-mirror according to an embodiment of the present invention.

FIG. 5 is a cross-sectional view schematically showing a structure including an electromagnetically actuated micro-mirror according to an embodiment of the present invention. For clarity's sake, only the differences with the structure shown in FIG. 4 will be detailed here.

Instead of magnet 41 with its lateral magnetic orientation, one provides for a group of three magnets having distinct magnetic orientations, arranged in such a manner as to create, in regard to moveable plate 1, a magnetic field parallel to the plane of frame 3 and orthogonal to the axis of rotation 11, sufficient for obtaining a displacement of moveable plate 1 without an excessive consumption of energy.

According to a preferred embodiment, three magnets 51, 53, 55 having, from a top-down view, the shape of bars parallel to axis 11, juxtaposed in a same plane parallel to frame 3 are provided. Magnet 51 has substantially the same width as the moveable plate 1, for example, on the order of 1 mm, and substantially the same length as the assembly formed by frame 3 and plate 1, for example of the order of 3 mm. The group of 3 magnets has substantially the same width as frame 3. It is of course understood that these dimensions are given solely for example purposes. The width of central magnet 51 may be slightly less, for example, or slightly greater than the width of moveable plate 1. Preferably, to limit the size, the dimensions of the group of magnets will be strictly equal or slightly less than those of the assembly formed by the stationary frame and the moveable plate. However, in the preceding, it is understood that "substantially the same width" refers to widths equal to substantially plus or minus 30%.

Central magnet 51 has a lateral magnetic orientation, in other words an orientation that is substantially parallel to the plane of frame 3 and substantially orthogonal to axis 11.

Peripheral magnets 53 and 55 have a vertical magnetic orientation, in other words an orientation that is substantially orthogonal to the plane of frame 3. The magnetic orientations of magnets 53 and 55 are substantially opposite in direction.

Thus, for moveable plate 1 and above the central part of the magnet group, field lines created by each of the magnets 51, 53, 55 are substantially lateral and in the same direction. These elements add up to create a lateral magnetic field, represented by arrow 57, sufficient to obtain a displacement of moveable plate 1 with a decreased consumption of energy. However, in regard to the magnet group opposite moveable plate 1, the field lines have a tendency to cancel each other out. This makes it possible in particular to limit the electromagnetic interactions with other elements of a device.

It is of course to be understood that the direction of the magnetic orientations of the peripheral magnets and the central magnet are selected in a suitable manner so that the lateral components of the field lines add up on the side of the moveable plate and cancel each other out on the bottom side of the magnets, and not the other way around.

Figure 6A:
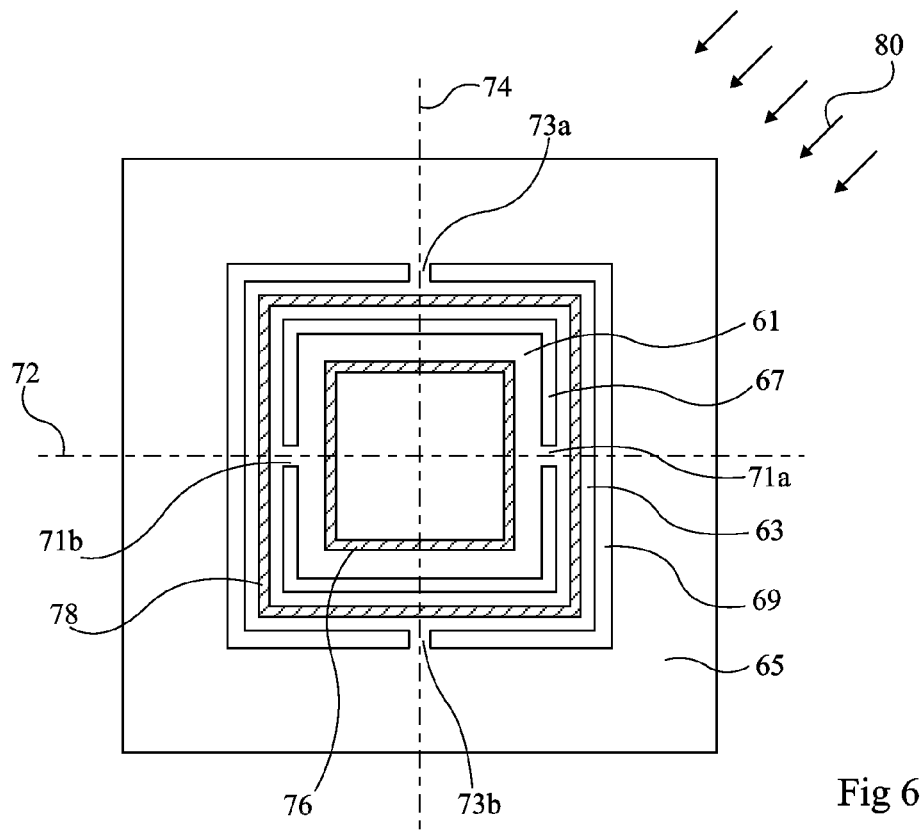
FIG. 6A is a schematic top view of a structure including an electromagnetically actuated micro-mirror according to a design variant of the present invention.
Figure 6B:
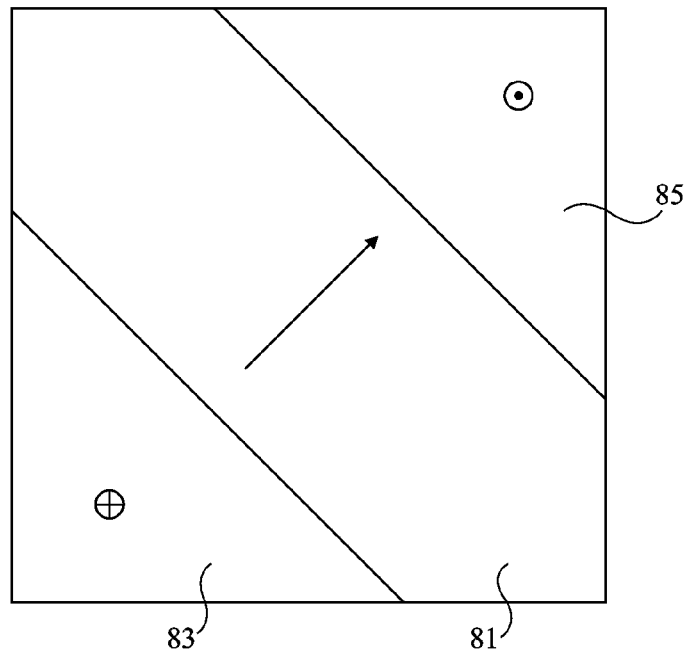
FIG. 6B is a top, cross-sectional view of FIG. 6.

FIGS. 6A and 6B schematically show a variant design of the present invention. They depict an MEMS structure comprising an electromagnetically actuated microshutter in which the microshutter is moveable relative to two distinct axes of rotation, for example orthogonal ones.

FIG. 6A is a top-down view. A moveable plate 61 is connected to a moveable frame 63, itself connected to a stationary frame 65. Two gaps 67 and 69 extend respectively between moveable plate 61 and moveable frame 63, and between moveable frame 63 and stationary frame 65. Plate 61 is connected to moveable frame 63 by two arms 71*a* and 71*b* aligned on both sides of the plate along an identical axis 72. Thus, plate 61 is rotatable about axis 72. Moveable frame 63 is connected to stationary frame 65 by two arms 73*a* and 73*b* aligned on both sides of the moveable frame along an identical axis 74, for example orthogonal to axis 72. Thus, moveable frame 63 is rotatable about axis 74. Plate 61 is therefore moveable, via moveable frame 63, relative to the two orthogonal axes of rotation 72 and 74.

As in the examples described in relation to FIGS. 1, 2, 4, and 5, a conductive path 76 follows the periphery of the front face of moveable plate 61. The extremities of path 76 (not shown) run across one of the mounting arms of plate 61 and across one of the mounting arms of moveable frame 63, and end, on frame 65, in contacts that are suited for connecting to a power source.

In addition, a conductive path 78 follows the periphery of the front face of moveable frame 63. The extremities of path 78 (not shown) run across one of the mounting arms of the moveable frame and end, on frame 65, in contacts suited for being connected to a power source.

The assembly consisting of frame 65, moveable frame 63, and plate 61 is subjected to a magnetic field represented by arrows 80, substantially parallel to the plane of the frame, and substantially oriented at 45° relative to the axes of rotation 72 and 74.

It is possible to individually actuate each of the axes 72 and 74 by varying the sign and value of the current applied in each of the paths 76 and 78. The rotating movement of plate 61 in relation to axis 72 is associated with the component of magnetic field 80 that is orthogonal to axis 72. The movement of moveable frame 63 in relation to axis 74 is associated with the component of magnetic field 80 that is orthogonal to axis 74.

FIG. 6B is a cross-sectional, top-down view of the MEMS structure of FIG. 6A, schematically representing an group of three magnets having distinct magnetic orientations, arranged under the assembly, shown in FIG. 6A, formed by moveable plate 61, moveable frame 63, and frame 65. This group of magnets is suitable for creating, for plate 61 and moveable frame 63, magnetic field 80 that is substantially parallel to the plane of frame 65 and substantially at 45° in relation to axes of rotation 72 and 74.

Similar to the embodiment described in relation to FIG. 5, there are provided three magnets 81, 83, 85 having, in a top-down view, the shape of bars orthogonal to the direction of field 80, juxtaposed in a same plane parallel to frame 65. The bars forming magnets 81, 83, 85 are preferably cut in such a manner that the group of magnets does not extend past the assembly consisting of frame 65, moveable frame 63 and plate 61.

Central magnet 81 has a lateral magnetic orientation, substantially parallel to the plane of frame 65 and substantially at 45° in relation to the axes of rotation 72 and 74. Peripheral magnets 83 and 85 have a vertical magnetic orientation, substantially orthogonal to the plane of frame 65. The magnetic orientations of magnets 83 and 85 have an substantially opposite direction.

In regard to plate 61 and moveable frame 63, the field lines created by each of the magnets 81, 83, and 85 are substantially parallel to the plane of frame 65, substantially at 45° relative to axes 72 and 74, and substantially of the same direction. These elements add up to create the magnetic field shown in FIG. 6A by arrows 80.

An advantage of the proposed embodiments is that the magnets are arranged under the assembly formed by the moveable plate and the frame and they do not extend past this assembly. This enables one to reduce by at least a factor of two the surface area of a micro-mirror in relation to a conventional structure of the type shown in FIG. 2. In addition, the absence of magnets having thicknesses greater than that of the silicon, on both sides of the frame, allows one, in the case of a micro-mirror, to increase the angles of incidence of the light rays.

A particular advantage of the structure shown in FIGS. 6A and 6B is that, when the mirror is placed on one of its sides, it is oriented to horizontally and vertically reflect a beam, which corresponds to the deflection directions most often desired in actual practice.

In addition, in the proposed embodiments, the magnetic field created in regard to the moveable plate is sufficient to obtain displacements of the plate with a decreased consumption of electricity. This is particularly associated with the fact that the magnets are placed very close to the conductive paths in comparison to conventional structures. To further reduce the distance between the magnets and conductive paths, one can use a thin silicon wafer.

Furthermore, the movements of the plate are controlled by the flow of current in a simple loop arranged at the periphery of the plate. Accordingly, the losses of useful surface area on the plate, associated with the conductive paths, are minimized. More generally, the three-magnet structure described above has the advantages of having a small size and creating a strong lateral magnetic field in a localized space.

Figure 7:
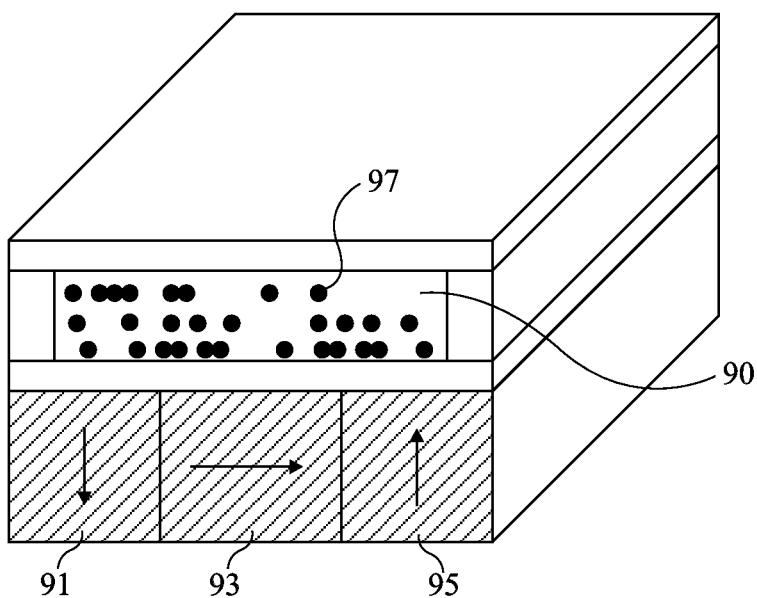
FIG. 7 is a perspective view showing another example of an application of a part of the structure described in relation to FIG. 5.

FIG. 7 shows another example of an application of a three-magnet structure of the type described above. In this example, the group of magnets is used to interact with magnetic microbeads or with cells suspended in a biological analysis device.

This device comprises a channel 90 defined by partitions. Under channel 90, there are arranged three magnets 91, 93, and 95, having distinct magnetic orientations, so as to create, in regard to the channel, a lateral magnetic field. In this example, the magnetic orientations of the magnets, represented in the drawing by arrows, are identical to those of the three-magnet assembly of FIG. 5.

In channel 90, there flows a fluid comprising magnetic microbeads 97 (occasionally described in technological terms by "super-para-magnetic beads"), for example beads comprising iron oxide particles and whose diameter is between 50 nm and 3 µm. Particles suited for capturing biological targets (molecules, cells, viruses, etc.) may have first been grafted on beads 97. Provisions may be made for different types of beads and/or different types of grafted particles, suitable for capturing different type of biological targets.

The magnetic field and the gradient of the magnetic field to which is subjected channel 90 allow one to trap the beads to separate those that have captured a biological target from those that have not. This enables one, for example, to measure the concentration of the biological target in question in the fluid. In addition, the gradient of the magnetic field allows one to separate the beads that have captured different biological targets.

Furthermore, in the fluid, cells may also be circulating that, due to their diamagnetic or paramagnetic properties, are drawn or repulsed directly by the field and the field gradient generated by the structure of magnets. One could then dispense with beads 97 to act on these cells.

Particular embodiments of the present invention have been described. Diverse variants and modifications will become apparent to one having ordinary skill in the art. In particular, the invention is not limited to the application described above, namely moveable micro-mirrors. One can also implement the sought after functioning on any device comprising electromagnetically actuated moveable microshutters. One can also adapt the invention to other types of devices comprising shutters, membranes, or other moveable structures, for example acceleration sensors, gyroscopes, pressure sensors, and microphones, based on the principle of electromagnetic actuation or motion detection using an electromagnetic field.

In addition and in relation to FIGS. 5 and 6B preferred embodiments of the present invention have been described that comprise a central magnet having a lateral magnetic orientation and two peripheral magnets having vertical magnetic orientations in the opposite direction. One having ordinary skill in the art will know how to implement the sought after functioning by using other configurations.

Furthermore, the embodiments described in relation to FIGS. 5 and 6A, 6B provide for two peripheral magnets with a vertical magnetic orientation. To optimize the intensity of the lateral magnetic field in regard to the moveable plate, one can, if necessary, use peripheral magnets having a slightly oblique magnetic orientation in relation to the vertical. Similarly, the central magnet may be split in two halves of a magnet having magnetic orientations that are slightly oblique in relation to the plane of the frame and oblique in relation to each other. In a three-magnet assembly, one can also provide for magnets having different widths so as to optimize the lateral field in regard to the moveable plate.

What is claimed is:

1. An electromagnetically actuated microshutter comprising:
    a moveable plate that can rotate about an axis, connected to a stationary frame by two arms aligned on both sides of the plate according to said axis, and comprising on its periphery a conductive loop; and
    below the assembly formed by the stationary frame and the moveable plate, a group of magnets having distinct magnetic orientations, arranged in such a manner so as to create, in regard to the moveable plate, a lateral magnetic field, in the plane of the frame, orthogonal to the axis of rotation,
    wherein said group of magnets comprises, three magnets in the form, when seen from above, of bars parallel to the axis of rotation, juxtaposed in a same plane parallel to the plane of the stationary frame, the central magnet having a width equal to that of the moveable plate and a lateral magnetic orientation; and the peripheral magnets having magnetic orientations that are orthogonal to the plane of the frame and of the opposite direction, the dimensions of the group of magnets being, when seen from above, equal to the dimensions of the assembly formed by the stationary frame and the moveable plate.

2. A microshutter according to claim 1, wherein said frame is rectangular and said arms extend from the middle of two opposite sides of the rectangle.

3. A microshutter according to claim 2, wherein the moveable plate is connected to the stationary frame by means of a moveable frame connected to the stationary frame by two second arms aligned on both sides of the moveable frame according to a secondary axis of rotation orthogonal to said axis, the moveable frame comprising a conductive loop, the magnetic field being substantially at 45 degrees in relation to the axis of rotation.

4. A microshutter according to claim 3, wherein the central magnet extends diagonally in a direction orthogonal to the field and the peripheral magnets are located in the corners of the structure left free by the central magnet.

5. A microshutter according to claim 1, wherein the extremities of the conductive loop run across one of said arms, and are connected to contact elements formed on the stationary frame.

6. A microshutter according to claim 1, wherein the upper surface of the moveable plate is reflective.

7. A microshutter according to claim 1, further comprising a protective cover disposed above the stationary frame.

* * * * *